United States Patent [19]

Merritt

[11] Patent Number: 6,154,864
[45] Date of Patent: Nov. 28, 2000

[54] READ ONLY MEMORY EMBEDDED IN A DYNAMIC RANDOM ACCESS MEMORY

[75] Inventor: Todd A. Merritt, Boise, Id.

[73] Assignee: Micron Technology, Inc., Boise, Id.

[21] Appl. No.: 09/081,133

[22] Filed: May 19, 1998

[51] Int. Cl.[7] .................................................. G06F 11/00
[52] U.S. Cl. ........................ 714/738; 714/718; 365/201
[58] Field of Search ................................. 714/738, 733, 714/724, 718, 734; 365/75, 103, 104, 190, 201; 711/102, 104, 105

[56] References Cited

U.S. PATENT DOCUMENTS

| 4,575,819 | 3/1986 | Nevill et al. | 365/201 |
|---|---|---|---|
| 4,855,803 | 8/1989 | Azumai et al. | 357/45 |
| 5,053,648 | 10/1991 | Van Den Elshout et al. | 307/469 |
| 5,351,213 | 9/1994 | Nakashima | 365/201 |
| 5,388,076 | 2/1995 | Ihara | 365/200 |
| 5,732,013 | 3/1998 | Von Basse et al. | 365/104 |
| 5,757,690 | 5/1998 | McMahon | 365/104 |
| 5,831,892 | 11/1998 | Thewes et al. | 365/94 |
| 5,900,008 | 5/1999 | Akao et al. | 711/100 |
| 5,917,744 | 6/1999 | Kirihata et al. | 365/63 |
| 5,961,653 | 10/1999 | Kalter et al. | 714/7 |
| 5,966,315 | 10/1999 | Muller et al. | 365/51 |
| 5,982,682 | 11/1999 | Nevill et al. | 365/201 |

Primary Examiner—Albert De Cady
Assistant Examiner—Samuel Lin
Attorney, Agent, or Firm—Dickstein Shapiro Morin & Oshinsky, LLP

[57] ABSTRACT

The present invention is embodied in a method and apparatus which provides a ROM embedded in an DRAM utilizing unused portions of the DRAM. By hardwiring the unused digitlines of the DRAM to either a specified voltage or ground, the outputs of the sense amplifiers associated with those unused digitlines can be programmed to output a specific logic state. By combining the outputs from several sense amplifiers, a fixed bit pattern can be produced. The fixed bit pattern can be used, for example, to generate a test data pattern for a Built-in Self Test or to generate an initialization sequence.

55 Claims, 7 Drawing Sheets

READ ONLY MEMORY EMBEDDED IN A DYNAMIC RANDOM ACCESS MEMORY

BACKGROUND OF THE INVENTION

1. Field of the Invention

The present invention relates to an embedded semiconductor memory, and in particular to a method and apparatus in which a Read Only Memory (ROM) is embedded in a Dynamic Random Access Memory (DRAM) by utilizing unused memory space of the DRAM.

2. Description of the Related Art

In a VLSI (Very Large Scale Integration) semiconductor chip design, both logic cells and memory cells may be incorporated onto a single chip. An embedded DRAM is a complex semiconductor circuit containing significant amounts of both DRAM and logic cells. This results in a compact design with minimal propagation distances between the logic cells and the memory cells. Embedded DRAM also offers the advantages of simpler system-level design, fewer packages with fewer pins, reduced part count, and lower power consumption.

The dense integration of logic on a single system has created immense problems for the test engineer. Often, the only way to handle such complexity is to divide the system into independently testable blocks, called macro testing. One such block is the DRAM.

Memory tests on random access memory (RAM) integrated circuits, such as DRAMs and SRAMs and the like are typically performed by the manufacturer during production and fabrication and also by a downstream manufacturer of a computer or processor controlled system as well as by an end-user during computer initialization to determine if the circuits are operating as intended. The testing is typically performed by a memory controller or processor (or a designated processor in a multi processor machine) which runs a testing program.

Random access memories are usually subjected to data retention tests and/or data march tests. In data retention tests, every cell of the memory is written and checked after a pre-specified interval to determine if leakage current has occurred that has affected the stored logic state. In a march test, a sequence of read and/or write operations is applied to each cell, either in increasing or decreasing address order. Such testing ensures that hidden defects will not be first discovered during operational use, thereby rendering end-products unreliable. In order to reduce the number of address lines and time required to conduct a memory test, the memory test may be done in a so-called compressed mode in which banks of memory locations are tested in parallel, with the memory locations of one bank being tested against those of another, rather than one at a time.

Figure 1:
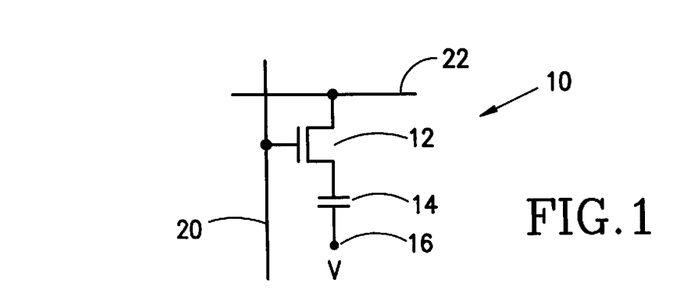
FIG. 1 illustrates in schematic diagram form a standard Dynamic Random Access Memory (DRAM) cell.

A modern DRAM memory cell or memory bit (mbit) 10 is illustrated in FIG. 1. It is formed of a transistor 12 and capacitor 14. The cell 10 is capable of holding binary information in the form of a stored charge on the capacitor. The binary information is defined as either a logic '1' or a logic '0', depending upon the charge stored on the capacitor 14. The common node 16 of capacitor 14 is biased to a voltage V. Various leakage paths cause the stored capacitor charge to slowly deplete. To return the stored charge and thereby maintain the stored data state, the cell must be refreshed. The gate of transistor 12 is connected to wordline 20. When wordline 20 is activated, the charge stored on capacitor 14 is dumped onto digitline 22, causing the voltage of digitline 22 to either increase or decrease according to the charge stored by capacitor 14.

Figure 2:
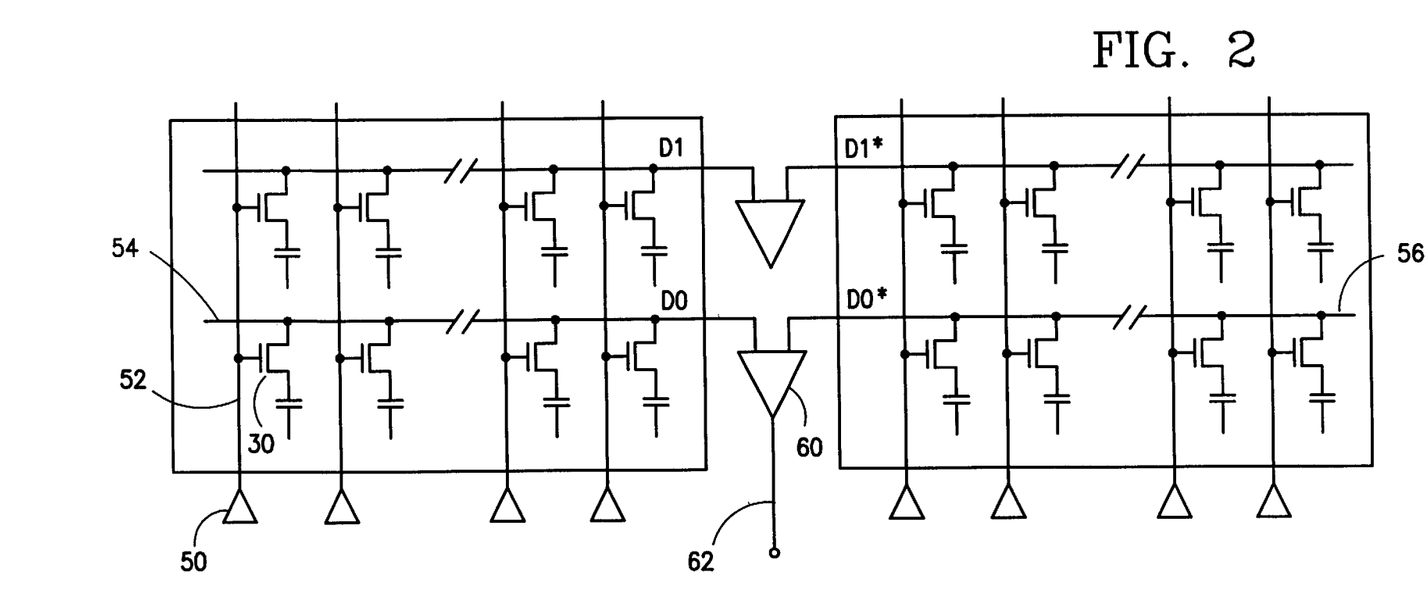
FIG. 2 illustrates in schematic diagram form a typical DRAM memory array comprised of a number of DRAM cells.

FIG. 2 illustrates a memory array formed by tiling a selected quantity of cells 10 of FIG. 1 together such that cells along a given digitline do not share a common wordline and cells along a common wordline do not share a common digitline. To read the data stored in a cell 30 of the array, cell 30 is accessed by wordline driver 50 activating wordline 52. When the transistor of cell 30 is turned on, the charge stored by the capacitor of cell 30 is dumped onto digitline 54, labeled D0. Digitline 54 is input into a sense amplifier 60. The other input to sense amplifier 60 is digitline 56, labeled D0*. The charge on digitline 54 from cell 30 creates a differential voltage between digitlines 54 and 56. This differential signal is read by sense amplifier 60 and an output associated with the logic state of cell 50 is output from the array on line 62.

Although the structure of the DRAM is simple, it is difficult to test because it is sequential, each address is uniquely addressable, and the DRAM is susceptible to a variety of fault conditions, each requiring a unique test. One method of testing an embedded DRAM is the built-in self test (BIST). Conventional (hardware-based) self-tests generally use a dedicated controller (i.e., a dedicated state machine such as a programmable logic array) and a data pattern generator which together generate test patterns and then cycle the DRAM through a predefined sequence of operations. However, such self tests suffer from the disadvantage that a large amount of on-chip hardware may be required to create the data pattern generator.

A standard DRAM, called a "commodity" DRAM, has a very specific array core size defined by powers of 2 (for example a 64K block or a 256K block). When used in an embedded application, this may not be the case. For example, the application may require less than a standard commodity block of memory. The options would be to produce a special DRAM array core size with the specific block size required, or to provide a standard commodity block and not use all of the memory space available in that block. It is preferable to provide a commodity block DRAM, since there are several advantages in keeping the basic core block a constant size, i.e., defined with respect to a power of 2. These advantages include design throughput and controlled, well-known time constants. Thus, when a commodity DRAM is provided in an embedded application, there may be die space which is not utilized for any purpose.

Figure 3:
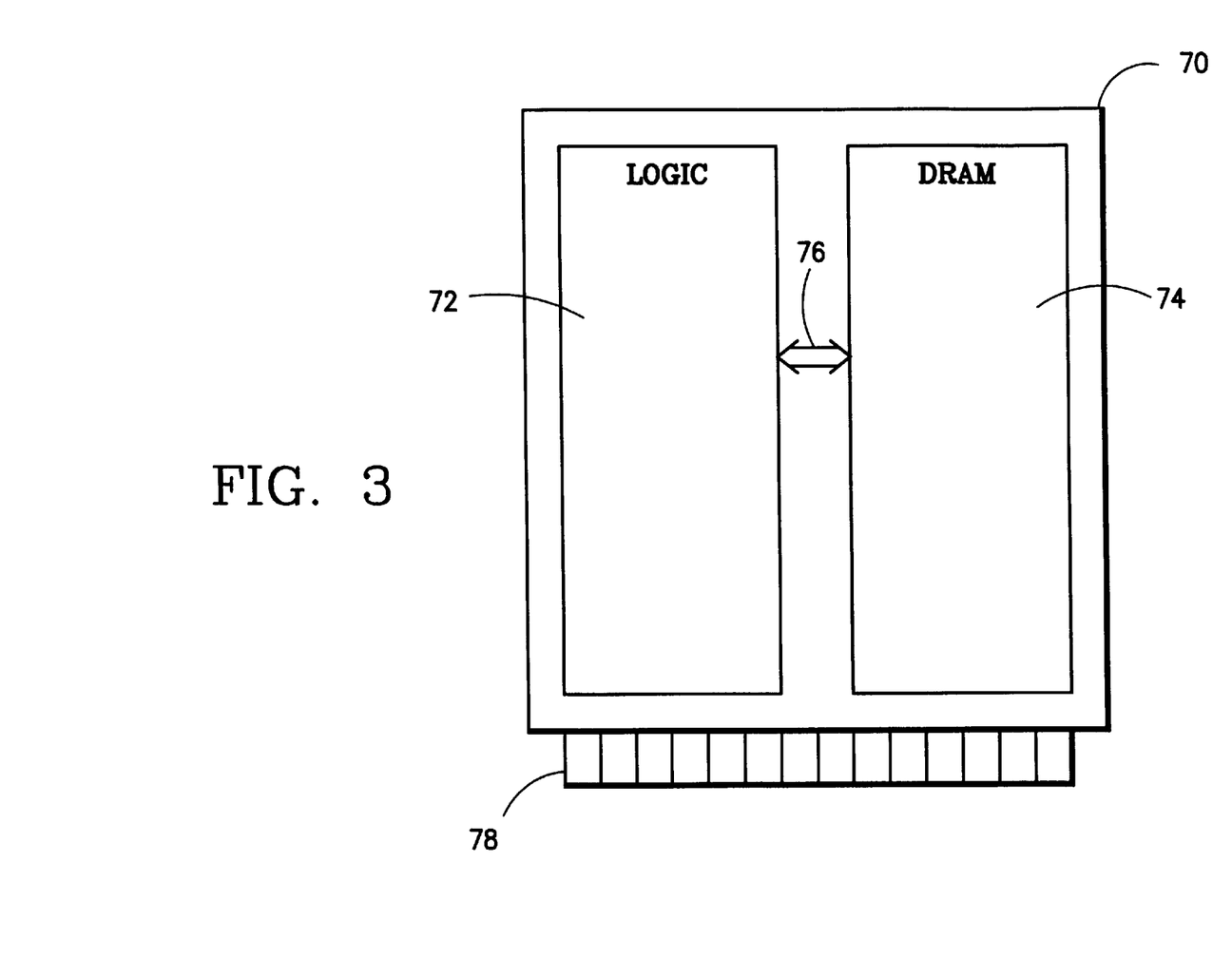
FIG. 3 illustrates in block diagram form a DRAM embedded in a semiconductor circuit.

FIG. 3 illustrates in block diagram form an application specific semiconductor chip 70 in which a DRAM is embedded. Semiconductor chip 70 comprises logic circuitry 72, which controls the specific application, and DRAM memory array 74. Data is passed between logic circuitry 72 and DRAM 74 over bus 76. Semiconductor chip 70 is connected to a processor system by I/O connector 78. An example of a specific application in which embedded DRAM is used is a circuit which combines a graphics accelerator and DRAM on the same chip. If the entire block of DRAM 74 is not used for the specific application of semiconductor chip 70, the memory not used will occupy space with no beneficial function. Thus, there may be unused memory space of an embedded DRAM which is not used efficiently.

SUMMARY OF THE INVENTION

The present invention provides a unique method of and apparatus for utilizing unused die space of an embedded commodity DRAM as a ROM which can be used, for example, to generate test patterns for a Built-in Self Test (BIST) or an initialization sequence, or any other ROM application.

In a first preferred embodiment, the unused digitlines of the embedded commodity DRAM, in which a block of sense amplifier circuits is placed at the edge of the DRAM array with both true and complement digitlines coming from a single array, are hard wired to a specified voltage or ground, representing a logic '1' or logic '0'. Because the digitlines are hard wired, the logic state on each line is permanently programmed. Thus, the digitlines essentially become a ROM memory. The data on the ROM digitlines can be used to generate a test pattern for a BIST or an initialization sequence, or any other ROM application.

In a second preferred embodiment, the unused digitlines of the embedded commodity DRAM, in which a block of sense amplifiers is located between two arrays and shared by the two arrays, are hard wired to a specified voltage or ground, representing a logic '1' or logic '0'. Because the digitlines are hard wired, the logic state on each line is permanently programmed. Thus, the digitlines essentially become a ROM memory. The data on the ROM digitlines can, once again, be used to generate a test pattern for a BIST or an initialization sequence, or any other ROM application.

In yet a further embodiment, the unused digitlines of the embedded commodity DRAM are connected to an enabling signal which controls connection of the array to a sense amplifier. In this manner the digitlines can be programmed to maintain a certain state and again be used, for example, to generate a test pattern for a BIST or an initialization sequence, or any other ROM application.

The above and other objects, advantages and features of the invention will become more readily apparent from the following detailed description of the invention which is provided in connection with the accompanying drawings.

DETAILED DESCRIPTION OF THE PREFERRED EMBODIMENTS

The present invention will be described as set forth in the preferred embodiments illustrated in FIGS. 4–8. Other embodiments may be utilized and structural or logical changes may be made without departing from the scope of the present invention.

Figure 4:
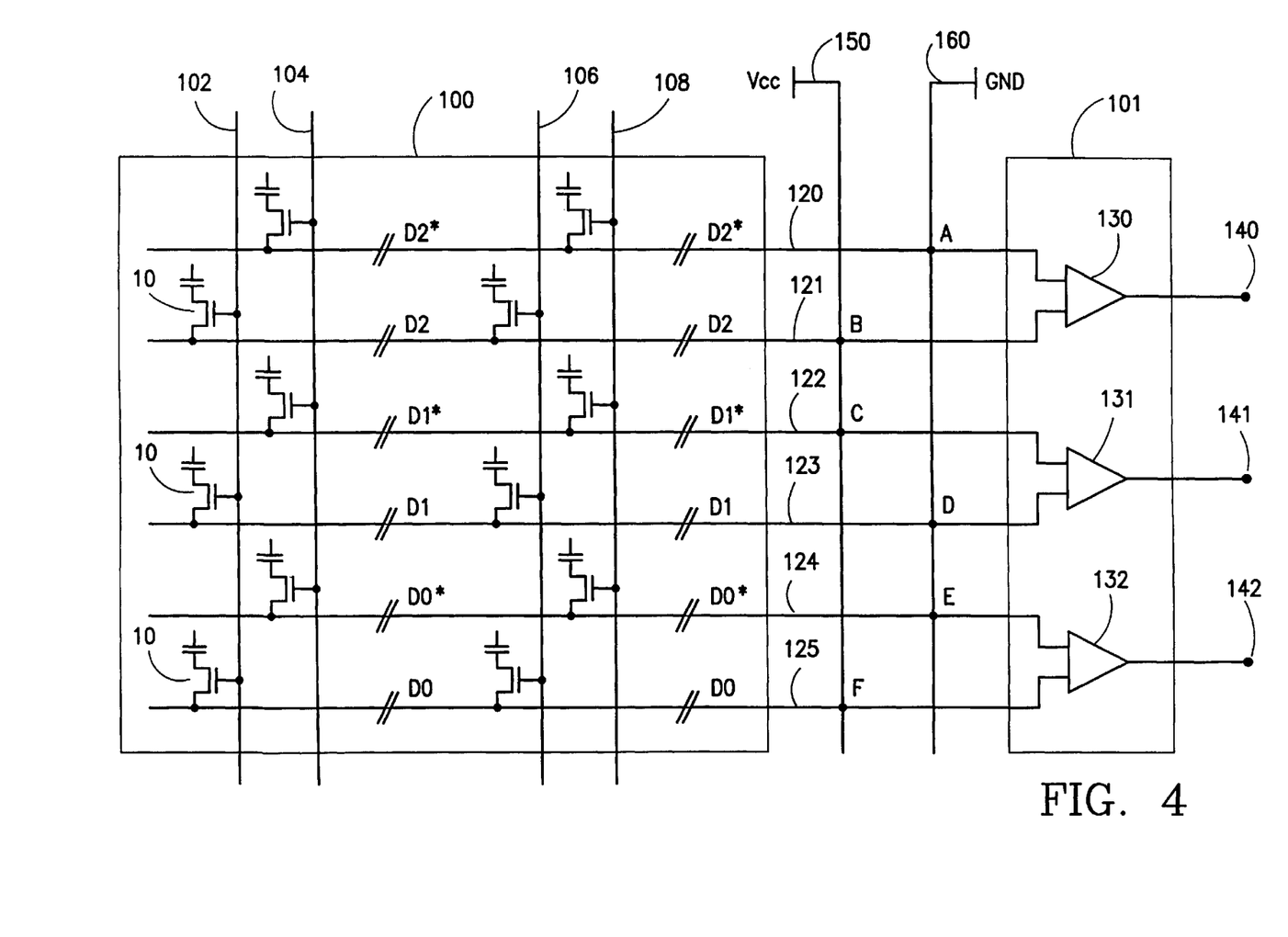
FIG. 4 illustrates in block diagram form an embedded DRAM in accordance with a first preferred embodiment of the present invention.

FIG. 4 illustrates a portion of an embedded DRAM in accordance with a first preferred embodiment of the present invention. The DRAM comprises an array 100 comprised of a number of DRAM cells 10 as previously described with respect to FIG. 1. A block of sense amplifier circuits 101, comprising sense amplifiers 130–132, is placed at the edge of the array with both true and complement digitlines (labeled DX and DX*) coming from the single array 100. For the embedded application, the portion of the array 100 shown would not be utilized. The actual number of cells not utilized will depend upon the application and size of the commodity DRAM block embedded in the application chip.

Wordlines 102, 104, 106, 108 are provided to access each cell 10. Digit lines 120, 121, 122, 123, 124, and 125, labeled D2*, D2, D1*, D1, D0*, and D0 respectively, connect each cell 10 to an input of a sense amplifier 130, 131 or 132. During normal operation of the array 100, when one of the cells 10 is accessed by an activated wordline and digitline the charge stored on the capacitor of that cell is dumped onto the associated digitline and read by the sense amplifier as previously described with respect to FIG. 2.

In accordance with the present invention, the active area of each cell 10, i.e. the digitlines 120–125, are stretched to provide space between the array and the sense amplifiers 130–132. During fabrication of the array 100, the mask is modified to allow connection of the digitlines 120–125 to either a specified voltage Vcc line 150, or a ground (GND) line 160. Thus, in the example illustrated in FIG. 4, digitline 120 is connected to ground line 160 at node A, digitlines 121, 122 are connected to Vcc line 150 at nodes B and C respectively, digitlines 123, 124 are connected to ground line 160 at nodes D and E respectively, and digitline 125 is connected to Vcc line 150 at node F. The actual pattern of connection for all unused digitlines need not be as illustrated above, but instead can be connected in any pattern desired to produce the desired outputs 140–142 from each of the sense amplifiers 130–132.

By hardwiring each of the digitlines 120–125 to either Vcc line 150 or ground line 160, the outputs 140–142 of each of the sense amplifiers 130–132 can be controlled, i.e., the outputs 140–142 can be programmed to output either a logic '1' or a logic '0'. The outputs 140–142 can be programmed to generate a specified pattern, and the pattern used, for example, in a Built-in self test (BIST).

Figure 5:
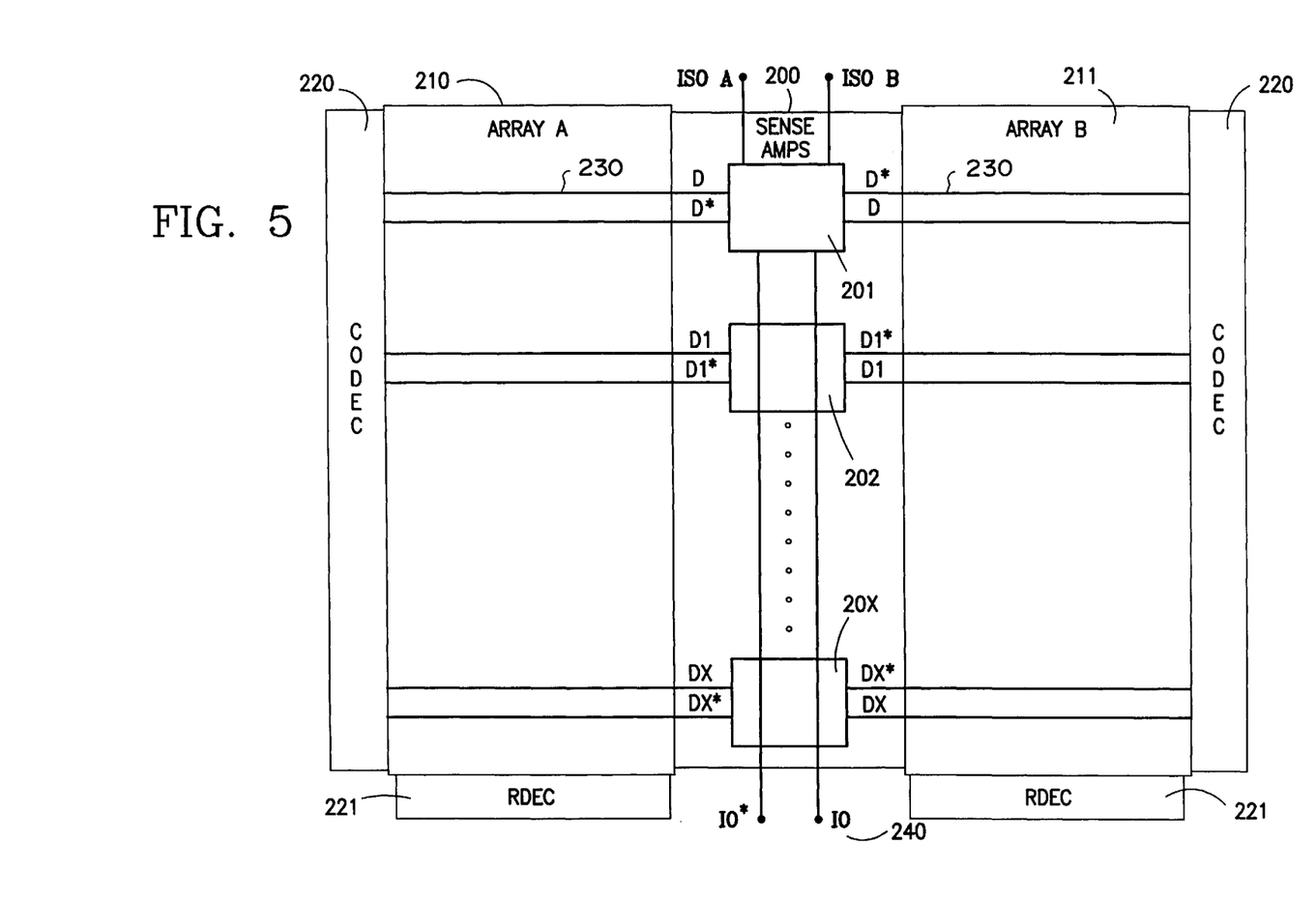
FIG. 5 illustrates in block diagram form a RAM memory array.

FIG. 5 illustrates in block diagram form a portion of an embedded DRAM in which two arrays share a block of sense amplifiers. In this embodiment, a block of sense amplifiers 200, comprised of sense amplifiers 201, 202 . . . 20X is placed between two arrays 210, 211 (labeled array A and array B). Each array 210, 211 is comprised of a plurality of cells as described with respect to FIG. 1. A column decoder 220 and row decoder 221 control the accessing of the cells in each of the arrays 210, 211. The digitlines from each array are input into the sense amplifiers 201, 202, 20X. The operation of the DRAM is similar to that described with respect to FIG. 2 and will not be repeated here.

Figure 6:
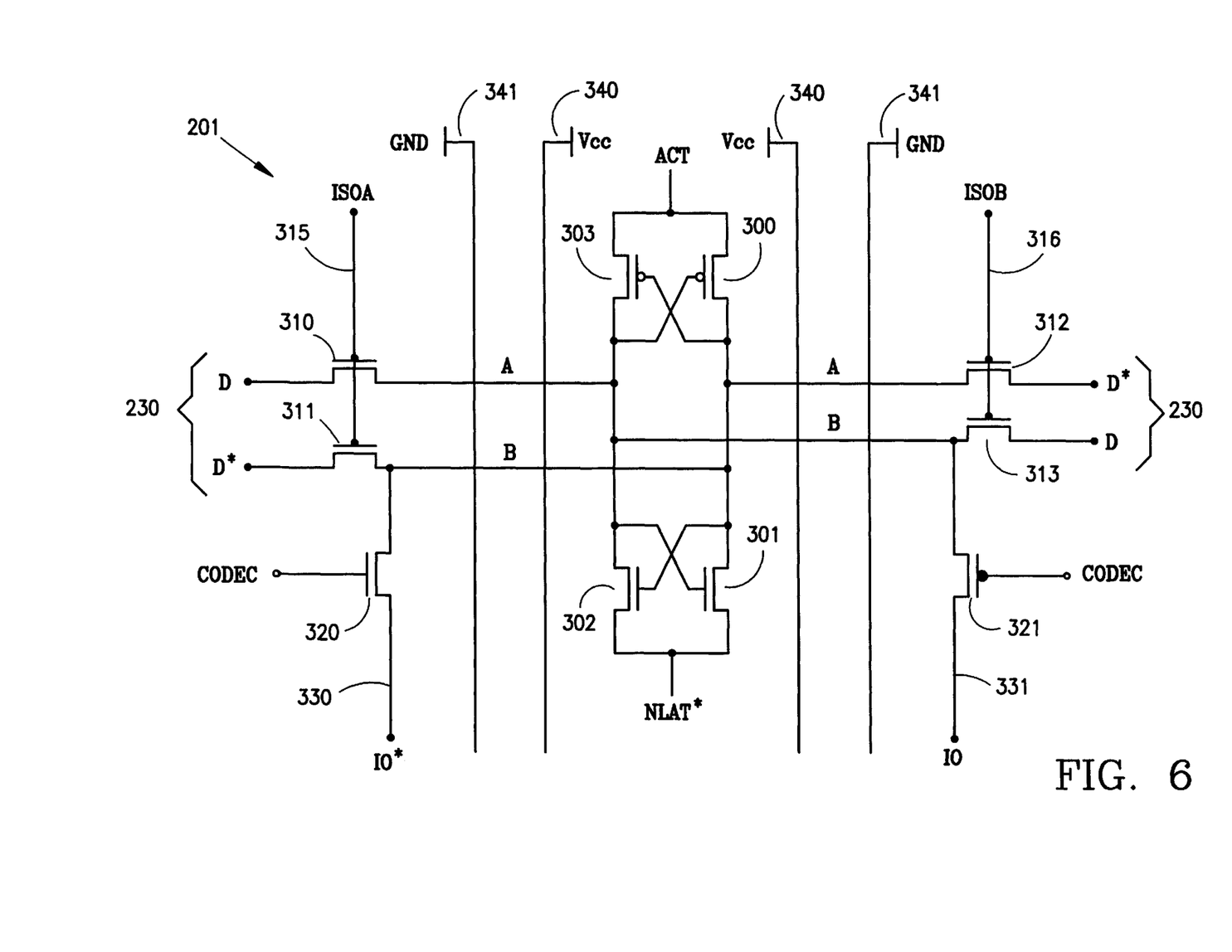
FIG. 6 illustrates in schematic form a sense amplifier according to a second embodiment of the present invention.

FIG. 6 illustrates in schematic form sense amplifier 201 of FIG. 5 connected in accordance with the present invention. Sense amplifier 201 consists of four transistors 300–303. The sense amplifier 201 is connected to the digitlines of each array 210, 211 through transistors 310, 311, 312, and 313. Transistors 310 and 311 are enabled by an ISOA signal on line 315, while transistors 312 and 313 are enabled by an ISOB signal on line 316. The ISOA and ISOB signals are used to control which array is connected to the sense amplifier 201, since only one of the arrays 210, 211 can be connected at a time. The outputs of the sense amplifier (labeled IO and IO*) on lines 330 and 331 are controlled by transistors 320, 321 which are enabled by a CODEC signal, which is a column select signal from the column decoder.

In accordance with the present invention, the digitlines 230 from each array 210 and 211 can be connected at nodes labeled A or B to either voltage Vcc line 340 or ground GND fine 341. The connection is made during a fabrication process of the memory array by changing a mask pattern. By hardwiring either of the digitlines 230 (labeled D and D*) to either Vcc line 340 or ground line 341, the outputs 330, 331 of sense amplifier 210 can be controlled, i.e., the outputs 330, 331 can be programmed to always output either a logic '1' or a logic '0'. By combining the outputs of a plurality of sense amplifiers connected according to the present invention, a specific pattern can be generated, and the pattern used, for example, in a Built-in self test (BIST) or an initialization sequence.

The actual pattern of connection for all unused digitlines to either ground line 341 or Vcc line 340 is determined according to design preference, simplicity, etc. to produce the desired signal pattern at the outputs of the sense amplifiers and need not be specifically recited here.

Figure 7:
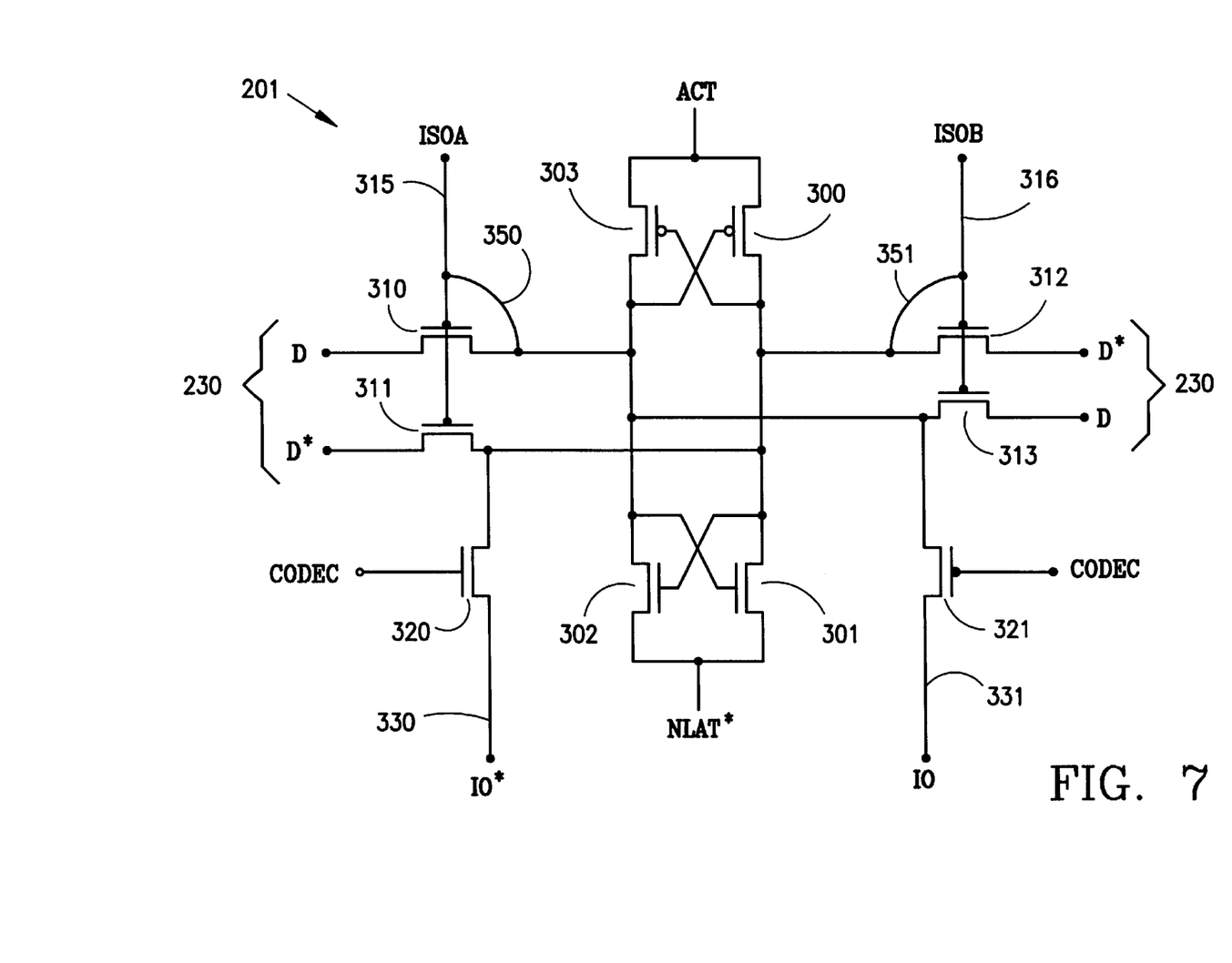
FIG. 7 illustrates in schematic diagram form a sense amplifier according to a third embodiment of the present invention.

FIG. 7 illustrates sense amplifier 201 from FIG. 5 according to another embodiment of the present invention. The basic construction of sense amplifier 201 is identical to that as described with reference to FIG. 6, and will not be repeated here. Similar elements between FIGS. 6 and 7 are designated by like numerals.

In accordance with a third preferred embodiment, the unused DRAM cells can be programmed by connecting one of the unused digitlines 230, i.e., either D or D*, from each array to its associated ISO signal. The connection is done during a fabrication process of the memory array.

Thus, for example, digitline 230 labeled D from array 210 could be connected to ISOA line 315 as shown by line 350, and digitline 230 labeled D* from array 211 could be connected to ISOB line 316 as shown by line 351. If digitline D is connected to the ISO signal line, the sense amplifier will always output a logic '1'. If digitline D* is connected to the ISO signal line, the sense amplifier will always output a logic '0'. By combining a plurality of the unused digitlines and sense amplifiers, a specific pattern of logic signals can be generated. The generated pattern could be utilized in a number of uses, including for example, a BIST or an initialization sequence.

The connection of the digitlines to the associated ISO lines need not be as described above, but can be done in any combination to produce the desired pattern. Thus, a single sense amplifier can be programmed to output any of the logic combinations '11', '10', '01', or '00' depending upon which digitline from each array is connected to the ISO signal.

Figure 8:
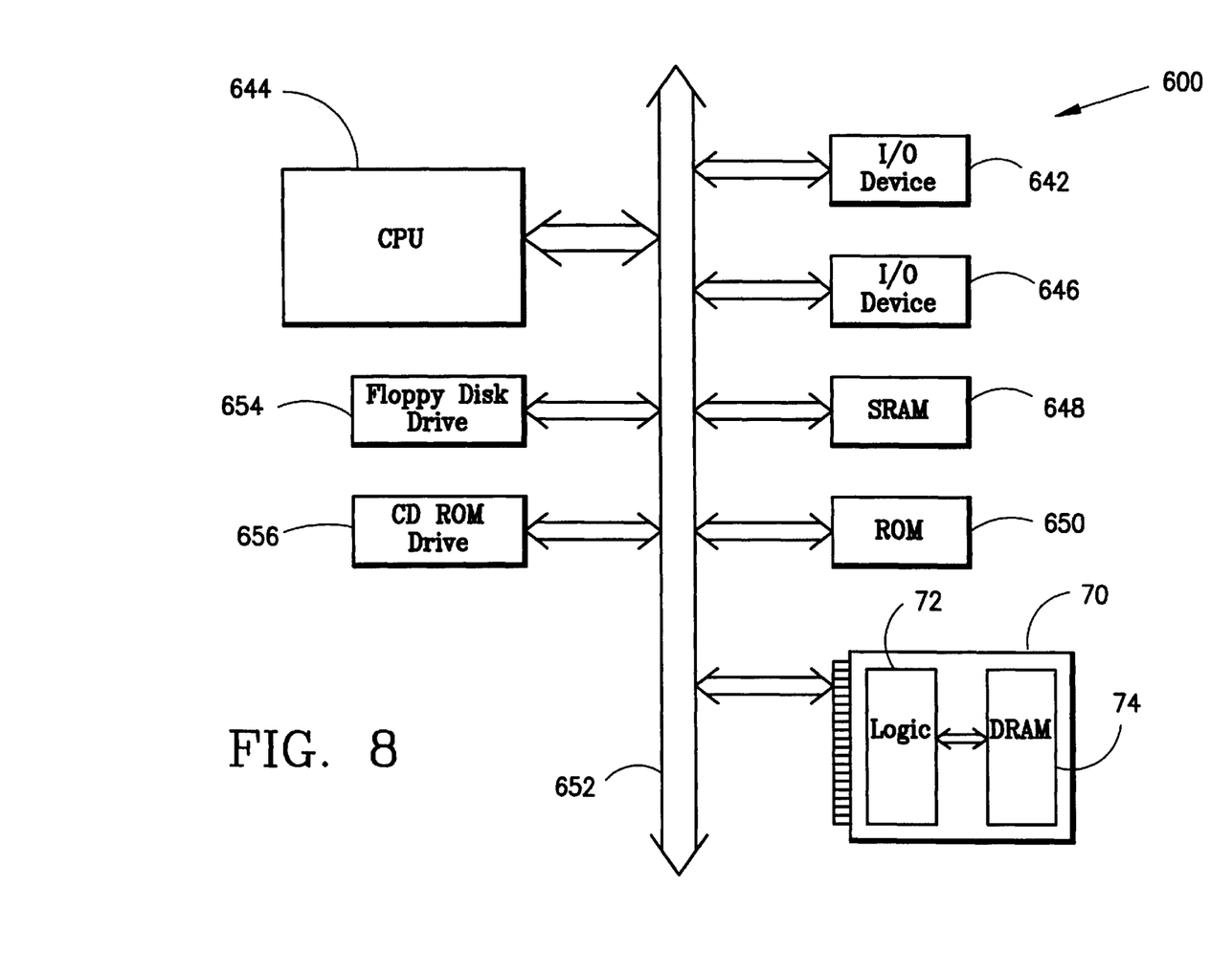
FIG. 8 illustrates in block diagram form a typical processor controlled system in which the present invention would be used.

A typical processor system which includes an embedded DRAM with embedded ROM according to the present invention is illustrated generally at 600 in FIG. 8. A computer system is exemplary of a device having digital circuits which include memory devices. Most conventional computers include memory devices permitting the storage of significant amounts of data. The data is accessed during operation of the computers. Other types of dedicated processing systems, e.g. radio systems, television systems, GPS receiver systems, telephones and telephone systems also contain memory devices which can utilize the present invention.

A processor system, such as a computer system, generally comprises a central processing unit (CPU) 644 that communicates to an input/output (I/O) device 642 over a bus 652. A second I/O device 646 is illustrated, but may not be necessary depending upon the system requirements. The computer system 640 also includes random access memory (RAM) 648, read only memory (ROM) 650, and may include peripheral devices such as a floppy disk drive 654 and a compact disk (CD) ROM drive 656 which also communicate with CPU 644 over the bus 652. An application specific semiconductor circuit 70, as previously described with respect to FIG. 3, may be placed in the processor system. The semiconductor circuit 70 includes logic circuitry 72 and an embedded DRAM 74 as illustrated in FIG. 3.

Utilizing the method of the present invention, unused memory space of the embedded DRAM 74 of semiconductor circuit 70 can be utilized as ROM which can be used, for example, to generate a test pattern for a BIST or an initialization sequence of semiconductor circuit 70. It must be noted that the exact architecture of the computer system 600 is not important and that any combination of computer compatible devices may be incorporated into the system.

Reference has been made to preferred embodiments in describing the invention. However, additions, deletions, substitutions, or other modifications which would fall within the scope of the invention defined in the claims may be found by those skilled in the art and familiar with the disclosure of the invention. Any modifications coming within the spirit and scope of the following claims are to be considered part of the present invention.

What is claimed as new and desired to be protected by Letters Patent of the United States is:

1. A method of programming memory space of at least one DRAM memory array to function as a ROM memory area, said at least one DRAM memory array comprising a plurality of DRAM cells and a plurality of wordlines and digitlines for addressing said plurality of DRAM cells, said method comprising the steps of:

selectively connecting at least one of said plurality of digitlines to one of two voltage sources, each of said voltage sources having a value which corresponds to a respective logical state used in said at least one DRAM memory array, to thereby form at least one programmed ROM memory area;

reading a voltage value from said at least one digitline; and outputting a signal representing said voltage value read from said at least one digitline.

2. The method according to claim 1, wherein said connecting of said at least one digitline to one of two voltage sources is done during a fabrication process of said at least one DRAM memory array.

3. The method according to claim 1, wherein one of said voltage sources is a ground potential.

4. The method according to claim 1, wherein one of said voltage sources is a voltage potential above ground.

5. The method according to claim 1, further comprising using at least one sense amplifier for reading a signal from a respective at least one digitline.

6. The method according to claim 5, wherein said at least one DRAM memory array includes at least first and second portions of said memory array and a plurality of sense amplifiers located between and shared by said first portion of said at least one DRAM memory array and said second portion of said at least one DRAM memory array.

7. The method according to claim 6, wherein digitlines associated with said plurality of DRAM cells of said first portion of said DRAM memory array are connected to said plurality of sense amplifiers by a plurality of first transistors, and digitlines associated with said plurality of DRAM cells of said second portion of said DRAM memory array are connected to said plurality of sense amplifiers by a plurality of second transistors.

8. The method according to claim 7, wherein said plurality of first transistors are enabled by a first control signal, and said plurality of second transistors are enabled by a second control signal.

9. The method according to claim 8, further comprising the steps of:
selectively connecting at least one of said plurality of said digitlines associated with said plurality of DRAM cells of said first portion of said DRAM memory array to said first control signal; and
selectively connecting at least one of said plurality of said digitlines associated with said plurality of DRAM cells of said second portion of said DRAM memory array to said second control signal.

10. The method according to claim 1, wherein said at least one DRAM memory array is an embedded DRAM memory array.

11. The method according to claim 1, further comprising the step of:
using a plurality of said ROM memory areas to produce a fixed bit pattern.

12. The method according to claim 11, further comprising the step of:
generating a test pattern signal from said fixed bit pattern.

13. A method for generating a fixed bit pattern utilizing memory space of at least one DRAM memory array, said at least one DRAM memory array comprising a plurality of DRAM cells and a plurality of wordlines and digitlines for addressing said plurality of DRAM cells, said method comprising the steps of:
selectively connecting at least one of said plurality of digitlines to one of two voltage sources, each of said voltage sources having a value which corresponds to a respective logical state used in said at least one DRAM memory array;
reading a voltage value from said at least one digitline; and
outputting a signal representing said voltage value read from said at least one digitline,
wherein a plurality of said signals output are combined to produce said fixed bit pattern.

14. The method according to claim 13, wherein said connecting of said at least one digitline to one of two voltage sources is done during a fabrication process of said at least one DRAM memory array.

15. The method according to claim 13, wherein one of said voltage sources is a ground potential.

16. The method according to claim 13, wherein one of said voltage sources is a voltage potential above ground.

17. The method according to claim 13, further comprising using at least one sense amplifier for reading a signal from a respective at least one digitlines.

18. The method according to claim 17, wherein said at least one DRAM memory array includes at least first and second portions of said memory array and a plurality of sense amplifiers located between and shared by said first portion of said DRAM memory array and said second portion of said DRAM memory array.

19. The method according to claim 18, wherein digitlines associated with said plurality of DRAM cells of said first portion of said DRAM memory array are connected to said plurality of sense amplifiers by a plurality of first transistors, and digitlines associated with said plurality of DRAM cells of said second portion of said DRAM memory array are connected to said plurality of sense amplifiers by a plurality of second transistors.

20. The method according to claim 19, wherein said plurality of first transistors are enabled by a first control signal, and said plurality of second transistors are enabled by a second control signal.

21. The method according to claim 20, further comprising the steps of:
selectively connecting at least one said plurality of said digitlines associated with said plurality of DRAM cells of said first portion of said DRAM memory array to said first control signal; and
selectively connecting at least one of said plurality of said digitlines associated with said plurality of DRAM cells of said second portion of DRAM memory array to said second control signal.

22. The method according to claim 13, wherein said at least one DRAM memory arrays is an embedded DRAM memory array.

23. The method according to claim 13, further comprising the step of:
using said fixed bit pattern to generate a test pattern signal.

24. A semiconductor circuit comprising:
a memory device, said memory device comprising at least one DRAM memory array, said at least one DRAM memory array comprising a plurality of DRAM cells, and a plurality of wordlines and digitlines for accessing said plurality of DRAM cells, each of said digitlines being associated with at least one of said DRAM cells; and
a plurality of sense amplifiers for reading a voltage on a digitline when said digitline is activated,
wherein at least one of said digitlines of said at least one DRAM memory arrays is connected to one of two voltage sources, each of said voltage sources having a value which corresponds to a respective logical state used in said DRAM memory array, to thereby function as a ROM storage area.

25. The semiconductor circuit according to claim 24, further comprising:
logic circuitry,
wherein said memory device is an embedded memory device.

26. The semiconductor circuit according to claim 24, wherein a plurality of said ROM storage areas provide a fixed bit pattern.

27. The semiconductor circuit according to claim 26, wherein said fixed bit pattern is used to generate a test pattern signal for a self test of said semiconductor circuit.

28. The semiconductor circuit according to claim 24, wherein one of said voltage sources is a ground potential.

29. The semiconductor circuit according to claim 24, wherein one of said voltage sources is a voltage potential above ground.

30. The semiconductor circuit according to claim 24, wherein said connecting of said at least one digitline to one of two voltage sources is done during a fabrication process of said DRAM memory array.

31. The semiconductor circuit according to claim 24, wherein said at least one DRAM memory array includes at least first and second portions of said memory array and a plurality of sense amplifiers located between and shared by said first portion of said DRAM memory array and said second portion of said DRAM memory array.

32. The semiconductor circuit according to claim 31, said semiconductor circuit further comprising:
a plurality of first transistors, wherein said digitlines associated with said plurality of DRAM cells of said first portion of said DRAM memory array are connected to said plurality of sense amplifiers by said plurality of first transistors; and
a plurality of second transistors, wherein said digitlines associated with said plurality of DRAM cells of said second portion of said DRAM memory array are connected to said plurality of sense amplifiers by said plurality of second transistors.

33. The semiconductor circuit according to claim 32, further comprising:
a first control signal, wherein said plurality of first transistors are enabled by said first control signal; and
a second control signal, wherein said plurality of second transistors are enabled by said second control signal.

34. The semiconductor circuit according to claim 33, wherein at least one of said digitlines associated with said plurality of DRAM cells of said first portion of said DRAM memory array is selectively connected to said first control signal, and at least one of said digitlines associated with said plurality of DRAM cells of said second portion of said DRAM memory array is selectively connected to said second control signal.

35. An integrated circuit comprising:
a semiconductor circuit, said semiconductor circuit comprising a memory device, said memory device comprising at least one DRAM memory array, said at least one DRAM memory array comprising a plurality of DRAM cells and a plurality of wordlines and digitlines for accessing said cells, each of said digitlines being associated with at least one of said DRAM cells, and a plurality of sense amplifiers for reading a voltage on a digitline when said digitline is activated; and
logic circuitry for performing functions beyond those required for operation of said DRAM memory array,
wherein at least one of said digitlines of said at least one DRAM memory arrays is selectively connectable to one of two voltage sources, each of said voltage sources having a value which corresponds to a respective logical state used in said at least one DRAM memory array, to thereby function as a ROM storage area.

36. The integrated circuit according to claim 35, further comprising:
a switching device connected to each of said voltage sources and operable to couple either voltage source to said digitline.

37. The integrated circuit according to claim 35, wherein a plurality of said ROM storage areas provide a fixed bit pattern.

38. The integrated circuit according to claim 37, wherein said fixed bit pattern is used to generate a test pattern for a self test of said integrated circuit.

39. The integrated circuit according to claim 35, wherein one of said voltage sources is a ground potential.

40. The integrated circuit according to claim 35, wherein one of said voltage sources is a voltage potential above ground.

41. The integrated circuit according to claim 35, wherein said at least one digitline is connected to one of two voltage sources during a fabrication process of said DRAM memory array.

42. The integrated circuit according to claim 35, wherein said at least one DRAM memory array includes at least first and second portions of said memory array and a plurality of sense amplifiers located between and shared by said first portion of said DRAM memory array and said second portion of said DRAM memory array.

43. The integrated circuit according to claim 42, said semiconductor circuit further comprising:
a plurality of first transistors, wherein said digitlines associated with said plurality of DRAM cells of said first portion of said DRAM memory array are connected to said plurality of sense amplifiers by said plurality of first transistors; and
a plurality of second transistors, wherein said digitlines associated with said plurality of DRAM cells of said second portion of said DRAM memory array are connected to said plurality of sense amplifiers by said plurality of second transistors.

44. The integrated circuit according to claim 43, further comprising:
a first control signal, wherein said plurality of first transistors are enabled by said first control signal; and
a second control signal, wherein said plurality of second transistors are enabled by said second control signal.

45. The integrated circuit according to claim 44, wherein at least one of said digitlines associated with said plurality of DRAM cells of said first portion of said DRAM memory array is selectively connected to said first control signal, and at least one of said digitlines associated with said plurality of DRAM cells of said second portion of said DRAM memory array is selectively connected to said second control signal.

46. A processor system comprising:
a central processing unit; and
a semiconductor circuit, said semiconductor circuit comprising a memory device, said memory device comprising at least one DRAM memory array, said at least one DRAM memory array comprising a plurality of DRAM cells and a plurality of wordlines and digitlines for accessing said cells, each of said digitlines being associated with at least one of said DRAM cells, and a plurality of sense amplifiers for reading a voltage on a digitline when said digitline is activated,
wherein at least one said digitlines of said at least one DRAM memory arrays is connected to one of two voltage sources, each of said voltage sources having a value which corresponds to a respective logical state used in said at least one DRAM memory array, to thereby function as a ROM storage area.

47. The processor system according to claim 46, wherein a plurality of said ROM storage areas provide a fixed bit pattern.

48. The processor system according to claim 47, wherein said fixed bit pattern is used to generate a test pattern signal for a self test of said semiconductor circuit.

49. The processor system according to claim 46, wherein one of said voltage sources is a ground potential.

50. The processor system according to claim 46, wherein one of said voltage sources is a voltage potential above ground.

51. The processor system according to claim 46, wherein said connecting of said at least one digitline to one of two voltages source is done during a fabrication process of said at least one DRAM memory array.

52. The processor system according to claim 46, wherein said at least one DRAM memory array includes at least first and second portions of said memory array and a plurality of sense amplifiers located between and shared by said first portion of said DRAM memory array and said second portion of said DRAM memory array.

53. The processor system according to claim 52, wherein said semiconductor circuit further comprises:

a plurality of first transistors, wherein said digitlines associated with said plurality of DRAM cells of said first portion of said DRAM memory array are connected to said plurality of sense amplifiers by said plurality of first transistors; and a plurality of second transistors, wherein said digitlines associated with said plurality of DRAM cells of said second portion of said DRAM memory array are connected to said plurality of sense amplifiers by said plurality of second transistors.

54. The processor system according to claim 53, wherein said semiconductor circuit further comprises:

a first control signal, wherein said plurality of first transistors are enabled by said first control signal; and a second control signal, wherein said plurality of second transistors are enabled by said second control signal.

55. The processor system according to claim 54, wherein at least one of said digitlines associated with said plurality of DRAM cells of said first portion of said DRAM memory array are selectively connected to said first control signal, and at least one of said digitlines associated with said plurality of DRAM cells of said second portion of said DRAM memory array are selectively connected to said second control signal.

* * * * *